(12) United States Patent
van Rijckevorsel et al.

(10) Patent No.: US 9,324,674 B2
(45) Date of Patent: Apr. 26, 2016

(54) DIE SUBSTRATE ASSEMBLY AND METHOD

(71) Applicant: NXP B.V., Eindhoven (NL)

(72) Inventors: Johannes Wilhelmus van Rijckevorsel, Ledeacker (NL); Emiel de Bruin, Elst (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/562,129

(22) Filed: Dec. 5, 2014

(65) Prior Publication Data

US 2015/0179599 A1 Jun. 25, 2015

(30) Foreign Application Priority Data

Dec. 24, 2013 (EP) .................................... 13199587

(51) Int. Cl.
*H01L 23/482* (2006.01)
*H01L 23/00* (2006.01)
*H01L 23/66* (2006.01)

(52) U.S. Cl.
CPC ............ *H01L 24/29* (2013.01); *H01L 23/4827* (2013.01); *H01L 23/66* (2013.01); *H01L 24/05* (2013.01); *H01L 24/27* (2013.01); *H01L 24/32* (2013.01); *H01L 24/83* (2013.01); *H01L 24/03* (2013.01); *H01L 2223/6644* (2013.01); *H01L 2224/03825* (2013.01); *H01L 2224/03826* (2013.01); *H01L 2224/0508* (2013.01); *H01L 2224/05026* (2013.01); *H01L 2224/05082* (2013.01); *H01L 2224/05083* (2013.01); *H01L 2224/05139* (2013.01); *H01L 2224/05144* (2013.01); *H01L 2224/05155* (2013.01); *H01L 2224/05644* (2013.01); *H01L 2224/2745* (2013.01); *H01L 2224/2746* (2013.01); *H01L 2224/27464* (2013.01); *H01L 2224/29084* (2013.01); *H01L 2224/29111* (2013.01); *H01L 2224/29139* (2013.01);

(Continued)

(58) Field of Classification Search
CPC ......... H01L 24/27; H01L 24/29; H01L 24/30; H01L 24/32; H01L 24/33; H01L 24/83
See application file for complete search history.

(56) References Cited

U.S. PATENT DOCUMENTS

| 5,698,897 A | 12/1997 | Nashimoto et al. |
| 2006/0108672 A1 | 5/2006 | Brennan et al. |

(Continued)

FOREIGN PATENT DOCUMENTS

| EP | 2 453 474 A1 | 5/2012 |
| EP | 2 693 465 A1 | 2/2014 |

(Continued)

OTHER PUBLICATIONS

Extended European Search Report for application 13199587.0 (Jun. 5, 2014).

(Continued)

*Primary Examiner* — Allan R Wilson
(74) *Attorney, Agent, or Firm* — McDonnell Boehnen Hulbert & Berghoff LLP

(57) ABSTRACT

A die comprising a body of semiconductor material, said body configured to receive a solder layer of gold containing alloy for use in die bonding said die to a substrate, wherein the die includes an interface layer on a surface of the body for receiving the solder layer, the interface layer having a plurality of sub-layers of different metals.

9 Claims, 2 Drawing Sheets

(52) U.S. Cl.
CPC ........... *H01L 2224/29144* (2013.01); *H01L 2224/29147* (2013.01); *H01L 2224/29155* (2013.01); *H01L 2224/32245* (2013.01); *H01L 2224/32502* (2013.01); *H01L 2224/83203* (2013.01); *H01L 2224/83207* (2013.01); *H01L 2224/83444* (2013.01); *H01L 2224/83805* (2013.01); *H01L 2924/014* (2013.01); *H01L 2924/01028* (2013.01); *H01L 2924/01047* (2013.01); *H01L 2924/01079* (2013.01); *H01L 2924/1421* (2013.01); *H01L 2924/15747* (2013.01)

(56) References Cited

U.S. PATENT DOCUMENTS

| | | | |
|---|---|---|---|
| 2007/0181986 A1* | 8/2007 | Yokoyama | 257/677 |
| 2008/0054439 A1* | 3/2008 | Malhan et al. | 257/690 |
| 2008/0128908 A1* | 6/2008 | Zimmerman et al. | 257/751 |
| 2009/0207580 A1* | 8/2009 | Oshika et al. | 361/820 |
| 2011/0089465 A1* | 4/2011 | Lin et al. | 257/99 |
| 2012/0025387 A1* | 2/2012 | Chang et al. | 257/773 |
| 2013/0043594 A1* | 2/2013 | Sasaki et al. | 257/762 |

FOREIGN PATENT DOCUMENTS

| | | |
|---|---|---|
| JP | S60 110127 A | 6/1985 |
| JP | 2012 178438 A | 9/2012 |
| WO | 2008/050251 A1 | 5/2008 |

OTHER PUBLICATIONS

Lui, Xingsheng et al; "Design and Implementation of Metallization on Structures for Epi-Down Bonded High Power Semiconductor Lasers"; Proceedings Electronic Components and Technology Conference, vol. 1, Las Vegas, NV, US; IEEE, Piscataway, NJ, US; pp. 798-806 (Jun. 2004).

* cited by examiner

DIE SUBSTRATE ASSEMBLY AND METHOD

CROSS-REFERENCE TO RELATED APPLICATIONS

This application claims the priority under 35 U.S.C. §119 of European patent application no. 13199587.0, filed on Dec. 24, 2013, the contents of which are incorporated by reference herein.

This invention relates to a method of attaching a die to a substrate. It also relates to a semiconductor die for attaching to a substrate. Further, the invention relates to a package comprising a die mounted on a substrate.

Package assembly includes the step of bonding a semiconductor die to a substrate, which is typically of metal. The substrate typically comprises CPC or a copper-tungsten alloy (CuW). CPC substrates comprise a sandwich of layers. The top and bottom layers are of copper with a layer in between the top and bottom layers comprising a copper-molybdenum (CuMo) alloy. The die itself is typically bonded to the substrate by a eutectic gold-silicon (AuSi) die bond process. Such a process involves the application of a relatively thick layer of gold (approximately 1000 to 2500 nm) on the substrate and on the die (typically 300 nm) before bonding the parts together. The current die bond process is expensive, typically due to the materials used, slow and requires high process temperatures.

According to a first aspect of the invention we provide a die comprising a body of semiconductor material, said body configured to receive a solder layer for use in die bonding said die to a substrate, wherein the die includes an interface layer on a surface of the body for receiving the solder layer, the interface layer having a plurality of sub-layers of different metals.

This is advantageous as providing an interface layer of a plurality of sub-layers of different metals (including alloys) between the semiconductor body and the solder layer has been found to improve the reliability of a die bond process (securing the die to a substrate) and the structural and thermal integrity of the resulting die-substrate.

The interface layer may extend over a majority of the surface of the die to which the solder layer is applied. The interface layer may extend inbetween the solder layer and the semiconductor body over substantially the whole area covered by the solder layer on the die or at least over 90% of it. For example, sawing lanes may be free of backside metal.

The sub-layers may comprise one or more of; a sub-layer of gold, a sub-layer of silver; a sub-layer of Nickel; a further sub-layer of gold. The interface layer may comprise a gold sub-layer adjacent the body and a gold sub-layer for receiving the solder layer and at least one further sub-layer of a metal other than gold between the gold sub-layers. The at least one further sub-layer may include a silver layer. The at least one further sub-layer may comprise a nickel layer. The at least one further sub-layer may include a sub-layer of nickel and a sub-layer of silver.

In other examples, the interface layer may contain one or more sub-layers of Titanium (Ti), Copper (Cu) and Nickel Vanadium (NiV) or Nickel (Ni).

In other embodiments the interface layer may comprise a first sub-layer of gold and a second sub-layer of silver (AuAg). Alternatively, the interface layer may comprise a first sub-layer of gold, a second sub-layer of Nickel and a third sub-layer of Silver. Such an interface layer may be electroplated with a Nickel (Ni) layer.

The interface layer comprises a first sub-layer of gold applied to the body, a second sub-layer of silver, a third sub-layer of Nickel and a fourth sub-layer of gold for receiving the solder layer. This arrangement in this particular order of sub-layers has been found to be advantageous.

The first sub-layer and fourth sub-layer may be thicker than the second and third sub-layers. Further, the outer sub-layers of the interface layer may be thicker than the inner sub-layer (s) of the interface layer.

The die may include a solder layer affixed to the interface layer and the solder layer may be at least two times thicker than the interface layer. Further, the solder layer may be at least three times, four times, or five times thicker. The interface layer may be substantially 1000 nm thick.

The sub-layers may be between 50 nm and 500 nm thick and preferably between 100 and 400 nm. Each sub-layer may have a lower limit thickness of 25 nm, 50 nm, 75 nm, 100 nm, 125 nm, 150 nm, 175 nm or 200 nm in combination with any of the following upper limit thicknesses, 200 nm, 250 nm, 300 nm, 350 nm, 400 nm, 450 nm and 500 nm. Each sub-layer may have a metal purity of at least 80%, or at least 95% or at least 98% or at least 99.9%. Preferably, each sub-layer contains a metal of substantially 100% purity.

The solder layer may comprise an alloy of gold. Alternatively, it may comprise an alloy of Copper, an alloy of Tin or a Copper Tin (CuSn) alloy. The solder layer may comprise an alloy of gold and tin (AuSn). This is advantageous as the presence of the interface layer may make AuSn bonding more reliable. The gold content of the solder layer may be between 75% and 85% by weight.

The die may be bonded to a substrate of copper by the solder layer. The use of a copper substrate may be more cost effective that a CuW or CPC substrate and the bond between the die and substrate may be reliable due to the use of the interface layer. Thus, the substrate may contain no or only trace amounts of Molybdenum.

The substrate, which may be of copper, may be substantially homogeneous. Thus, layers of different copper alloys may not be necessary. Instead, the substrate may be formed from a block of alloyed copper. The copper may have a purity of at least 95%, 99% or 99.8% by mass. The substrate may be at least half hard tempered, which may have advantageous hardness and stiffness properties.

The copper substrate may be plated with an outer layer. The outer layer may comprise an oxide prevention layer. The outer layer may comprise a Nickel-Palladium-Gold (NiPdAu) alloy. The outer layer may comprise an alloy containing one or more of gold, palladium and nickel. The outer plating layer may be less than 0.6 µm thick. For a NiPdAu outer layer, the Nickel thickness may be substantially 0.5 µm, the Palladium thickness may be substantially 0.05 µm and the Gold thickness may be substantially 0.010 µm. It will be appreciated that these are only example thicknesses.

The substrate may include a pad layer of gold arranged between the substrate and the solder layer of the die. Thus the pad layer may be adapted to receive the die and be adjoined to the die by the solder layer.

The package may comprises an RF power package. The die-substrate assembly is particularly suited to RF power applications where a high integrity and high thermal conductivity bond is required between the die and substrate, which may comprise a heat sink.

According to a second aspect of the invention we provide a method of forming a die for bonding to a substrate, comprising the steps of;

receiving a semiconductor body;

applying an interface layer to said semiconductor body, said interface layer comprising a plurality of sub-layers of different metals.

The method may further include the step of applying a solder layer of gold-tin alloy to said interface layer.

The step of applying the interface layer may comprise sputtering, evaporative plating or electroplating said layer.

The step of applying the interface layer may comprise applying a first sub-layer of gold to the semiconductor body. In particular, the first sub-layer of gold may be alloyed with the semiconductor body (e.g. silicon), which has been found to provide a good low ohmic contact. Further, the step of applying the interface layer may further comprise applying a second sub-layer of silver to the first sub-layer, applying a third sub-layer of Nickel to the second sub-layer and applying a fourth sub-layer of gold to the third sub-layer.

The method may include the step of receiving a substrate of copper; and bonding, using the solder layer, the die to the substrate. The bonding may comprise thermo-compression bonding. Alternatively thermo-sonic bonding may be used.

The method may include receiving the substrate of copper having a pad layer of gold thereon for receiving the solder layer of the die. The method may include the step of applying a pad layer to the substrate. The method may include the step of plating the substrate with an outer layer, which may comprise an alloy containing one or more of gold, palladium and nickel.

BRIEF DESCRIPTION OF THE DRAWINGS

There now follows, by way of example only, a detailed description of embodiments of the invention with reference to the following figures, in which.

DETAILED DESCRIPTION

Figure 1:
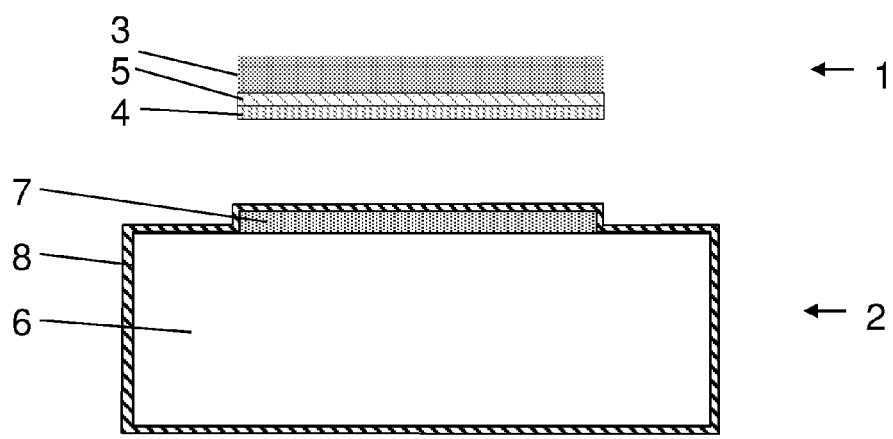
FIG. 1 shows an example embodiment of a die and substrate.

FIG. 1 shows a semiconductor die 1 and a metal substrate 2 for die bonding together using solder. This invention has particular application in the fabrication of RF power packages. The substrate, also known as a header or flange, may comprise a heat sink for the RF power package. It is important that fabrication costs are low while ensuring reliability of the resulting package. The relative thermal expansion between the semiconductor die 1 and substrate 2 needs to be managed, typically using expensive materials, while ensuring high thermal conductivity between the die 1 and the substrate 2. The present embodiment provides a cost-effective die and substrate and fabrication process while maintaining a high integrity solder interconnect between the die and the substrate to ensure structural reliability and effective thermal transfer.

The die 1 comprises a body 3 of semiconductor material, such as Silicon. The body 3 includes a solder layer 4 comprising an alloy containing gold for use in die bonding said die to the substrate 2. The solder layer, in some examples, may not contain gold. The die 1 includes an interface layer 5 between the body 3 and the solder layer 4, the interface layer 5 having a plurality of sub-layers of different metals.

The semiconductor body 3 is formed from a silicon wafer, which may have electronic components formed thereon. The body 3 may comprise a monocrystalline silicon or Gallium Arsenide or Gallium Nitride semiconducting material or any other semiconducting material. The backside of the body 3 has the interface layer 5 applied thereto.

The interface layer comprises a plurality of sub-layers and may comprise a gold sub-layer adjacent the body 3 and a gold sub-layer adjacent the solder layer and at least one further sub-layer of a metal other than gold between the gold sub-layers.

Figure 2:
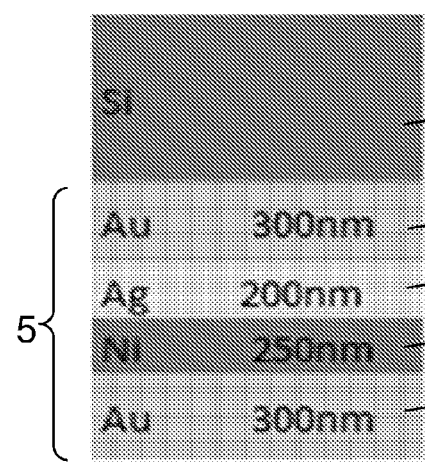
FIG. 2 shows a more detailed view of the interface layer.

FIG. 2 shows the die 1 and the interface layer 5 in more detail. The interface layer 5 comprises, in this embodiment four sub-layers 5a, 5b, 5c and 5d. The first sub-layer 5a is applied directly to the body 3 and comprises a layer of gold alloyed with the Si to obtain a low ohmic contact. The first sub-layer may be between 100 nm and 500 nm thick and preferably between 200 and 400 nm. The first sub-layer may have a lower limit thickness of 50 nm, 100 nm, 150 nm, 200 nm, 250 nm, 300 nm in combination with any of the following upper limit thicknesses 300 nm, 350 nm, 400 nm, 450 nm, 500 nm. In this embodiment the first sub-layer has a thickness of substantially 300 nm. The purity of the gold layer may be at least 80% or, preferably, at least 95% or at least 99% or substantially pure.

The second sub-layer 5b comprises, in this embodiment, a layer of silver applied to the first sub-layer 5a. The second sub-layer 5b may be thinner than the first sub-layer. The second sub-layer 5b may be between 50 nm and 400 nm thick and preferably between 100 and 300 nm. The second sub-layer 5b may have a lower limit thickness of 25 nm, 50 nm, 75 nm, 100 nm, 125 nm, 150 nm, 175 nm or 200 nm in combination with any of the following upper limit thicknesses 200 nm, 250 nm, 300 nm, 350 nm, 400 nm. In this embodiment the second sub-layer has a thickness of substantially 200 nm. The purity of the silver layer may be at least 80% or, preferably, at least 95% or at least 99% or substantially pure.

The third sub-layer 5c comprises, in this embodiment, a layer of nickel applied to the second sub-layer 5c. The third sub-layer 5c may be thicker than the second sub-layer and/or may be thinner than the first sub-layer 5a. The third sub-layer 5c may be between 100 nm and 450 nm thick and preferably between 200 and 350 nm. The third sub-layer 5c may have a lower limit thickness of 75 nm, 100 nm, 125 nm, 150 nm, 175 nm, 200 nm, 225 nm or 250 nm in combination with any of the following upper limit thicknesses 250 nm, 300 nm, 350 nm, 400 nm, 450 nm. In this embodiment the third sub-layer has a thickness of substantially 250 nm. The purity of the nickel layer may be at least 80% or, preferably, at least 95% or at least 99% or substantially pure.

The fourth and final sub-layer 5d before the solder layer is applied to the third sub-layer 5c and comprises, in this embodiment, a layer of gold. The fourth sub-layer may be between 100 nm and 500 nm thick and preferably between 200 and 400 nm. The fourth sub-layer may have a lower limit thickness of 50 nm, 100 nm, 150 nm, 200 nm, 250 nm, 300 nm in combination with any of the following upper limit thicknesses 300 nm, 350 nm, 400 nm, 450 nm, 500 nm. In this embodiment the fourth sub-layer has a thickness of substantially 300 nm. The purity of the gold, fourth sub-layer may be at least 80% or, preferably, at least 95% or at least 99% or substantially pure.

Figure 3:
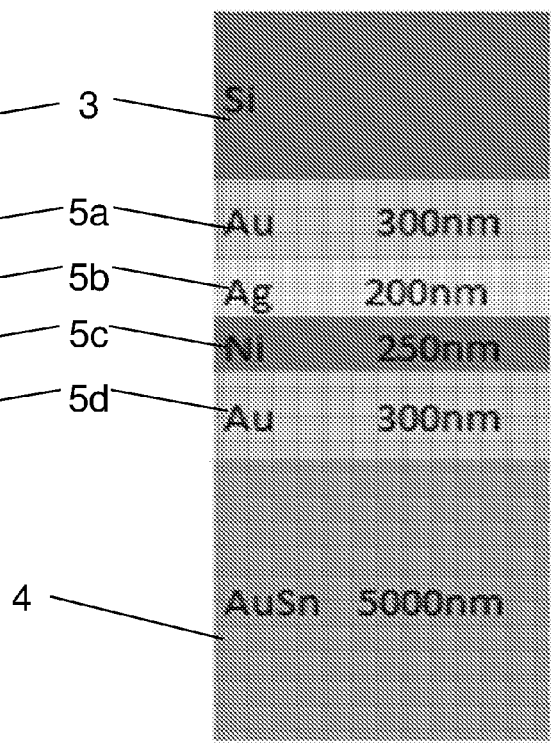
FIG. 3 shows a more detailed view of the interface layer with solder layer.

FIG. 3 shows the die 1 having the solder layer 4 applied to the interface layer and, in particular, the final (in this embodiment fourth) sub-layer of the interface layer 5. The solder layer comprises a layer for use in a soldering process to bond the die 1 to the substrate 2. The solder layer comprises, in this embodiment, an alloy of gold and tin (AuSn). The ratio of gold to tin in the alloy may be substantially 80/20 wt %. The solder layer may contain trace amounts of other substances. It has been found that the use of the interface layer may improve the integrity of the silicon die/solder bond.

The solder layer may have a thickness of at least 2000 nm or at least 3000 nm or at least 4000 nm. However, it will be appreciated that the solder layer may have any thickness depending on the particular application. In this embodiment, the solder layer has a thickness of substantially between 5000 nm and 7000 nm depending on die size. Thus, the solder layer 4 may be at least three or four times the thickness of the interface layer 5.

With reference to FIG. 1 again the substrate 2 comprises a homogeneous block 6 of copper. The purity of the copper may be at least 80%, 90%, 95% or 99.8%. The substrate block 6 comprises at least/substantially 90% by mass of the substrate. The substrate is homogeneous in that it does not contain sub-layers of different metals or alloys. This is advantageous as it is cost-effective for the substrate to be of copper rather than other typical substrates such as CPC or CuW. However, the substrate may include a pad 7. The pad 7 comprises a layer of silver disposed on at least part of a surface of the substrate 2. The pad 7 may be sized to substantially correspond to the size of the die 1 that is secured to the substrate 2. The silver pad 7 may have a purity of at least 90%, 95% or 98% or may be substantially pure. The substrate block 6 and possibly also the pad 7 may be plated with an outer layer 8.

The outer layer 8 comprises sub-layers of substantially pure nickel, palladium and gold (NiPdAu). Thus, the die 1 is soldered onto the outer layer 8.

Figure 4:
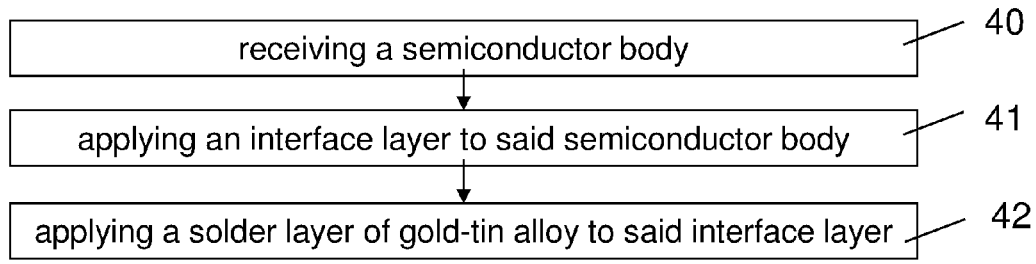
FIGS. 4 to 6 show a flow charts illustrating an example method of forming the die, substrate and a package.
Figure 5:
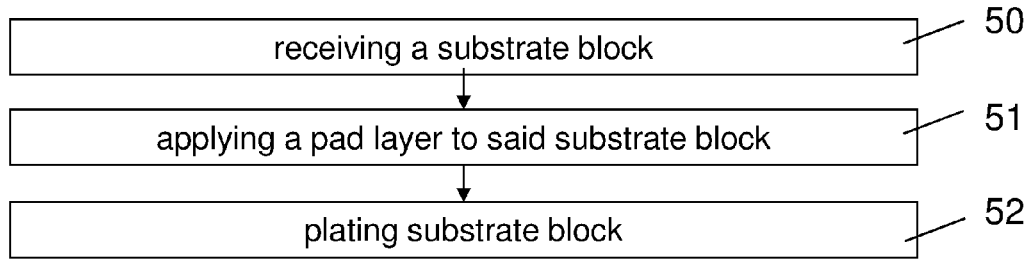
Figure 6:
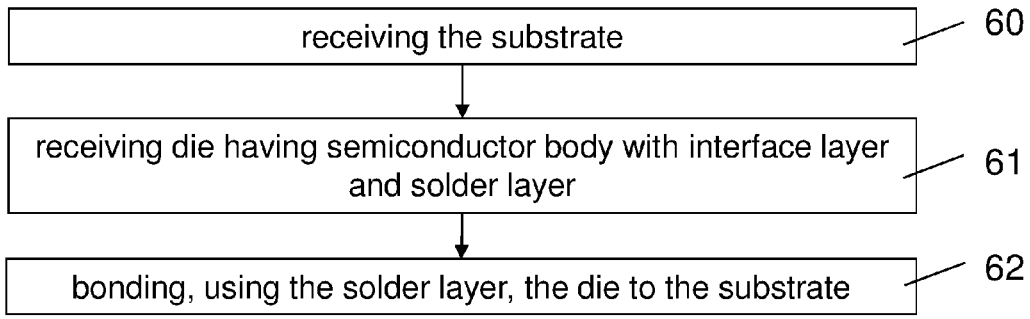

FIGS. 4, 5 and 6 comprise flow charts illustrating the various fabrication and assembly processes used to fabricate an RF power package according to an embodiment of the invention.

FIG. 4 shows receiving the body 3 of semiconductor material at step 40. Step 41 shows the application of the interface layer 5 to a backside of the body 3. The sub-layers of the interface layer 5 may be applied by sputtering, evaporation or electroplating or any other thin-film deposition technique. Thus, step 41 includes applying the first, gold, sub-layer 5a to the body 3; applying the second, silver, sub-layer 5b to the first sub-layer 5a; applying the third, nickel sub-layer 5c to the second sub-layer 5b; and applying the fourth, gold, sub-layer 5d to the third sub-layer 5c. The body 3 with interface layer 5 may be supplied as such but the method may also include, as illustrated in step 42, applying a gold-tin alloy solder layer 4 to the interface layer 5.

FIG. 5 shows the fabrication process for producing the substrate 2 ready for bonding to the die 1. The process comprises receiving a copper substrate block 6 comprising the main body of the substrate 2, at step 60. Step 61 shows applying a pad layer 7 of gold over at least part of a die bond surface of the substrate for receiving the die 1. The pad layer may be applied by any appropriate thin-film deposition technique. Step 62 shows electroplating the block 6 and pad layer with the outer layer 8.

FIG. 6 shows the steps of die bonding in which the die including the interface layer 5 and solder layer 4 is bonded to the substrate 2 including the pad layer 7 and outer plating layer 8. Step 60 shows receiving the substrate 1. Step 61 shows receiving the die comprising the semiconductor body 3 with interface layer 5 and solder layer 4. Step 62 illustrates the die bonding step in which the solder layer is thermo-compression bonded or thermosonically bonded to solder the die 1 to the pad layer 7 of the substrate 2.

In other embodiments the interface layer may comprise a first sub-layer of gold and a second sub-layer of silver (AuAg). Alternatively, the interface layer may comprise a first sub-layer of gold, a second sub-layer of Nickel and a third sub-layer of Silver. Such an interface layer may be electroplated with a Nickel (Ni) layer.

The invention claimed is:

1. A package comprising a substrate of copper coupled to a die by a solder layer, the solder layer comprising an alloy of gold and tin, the die comprising:
    a body of semiconductor material,
    wherein the die includes an interface layer on a surface of the body, and the solder layer is affixed to the interface layer;
    the interface layer includes a plurality of sub-layers of different metals;
    the interface layer comprises a first sub-layer of gold applied to the body, a second sub-layer of silver, a third sub-layer of nickel and a fourth sub-layer of gold; and
    the second sub-layer of silver is thinner than the third sub-layer of nickel.

2. The package according to claim 1, wherein the first sub-layer and fourth sub-layer are thicker than the second and third sub-layers.

3. The package according to claim 2, wherein the solder layer is at least two times thicker than the interface layer.

4. The package according to claim 1, wherein the substrate is substantially homogeneous.

5. The package according to claim 1, wherein the substrate includes a pad layer of gold arranged between the substrate and the solder layer.

6. The package according to claim 1, wherein the package comprises an RF power package.

7. A method of forming a package, comprising the steps of:
    receiving a substrate of copper;
    receiving a semiconductor body;
    applying an interface layer to the semiconductor body, the interface layer comprising a plurality of sub-layers of different metals,
    wherein the step of applying the interface layer comprises:
        applying a first sub-layer of gold to the semiconductor body,
        applying a second sub-layer of silver to the first sub-layer,
        applying a third sub-layer of nickel to the second sub-layer and
        applying a fourth sub-layer of gold to the third sub-layer; and
    wherein the second sub-layer of silver is thinner than the third sub-layer of nickel; and
    die bonding the semiconductor body with the interface layer to the substrate using a solder layer that comprises an alloy of gold and tin.

8. A method according to claim 7, wherein the step of applying the interface layer comprises sputtering, evaporative plating or electroplating said layer.

9. The method according to claim 7, wherein the substrate comprises a pad layer of gold thereon for receiving the solder layer.

* * * * *